United States Patent [19]

Labinsky et al.

[11] 4,068,165
[45] Jan. 10, 1978

[54] CIRCUIT FOR DETERMINING THE SLOPE OF A SIGNAL

[75] Inventors: Michael Labinsky; Michael Vetter, both of Karlsruhe, Germany

[73] Assignee: Siemens Aktiengesellschaft, Munich, Germany

[21] Appl. No.: 694,443

[22] Filed: June 9, 1976

[30] Foreign Application Priority Data

June 16, 1975 Germany .............................. 2526852

[51] Int. Cl.² .......................................... G01R 27/02
[52] U.S. Cl. .................................... 324/62; 328/162; 324/16 R; 324/57 N
[58] Field of Search ............... 324/62, 15, 16 R, 57 N; 340/347 AD, 347 NT, 347 CC; 328/162

[56] References Cited

U.S. PATENT DOCUMENTS

| | | | |
|---|---|---|---|
| 3,322,968 | 5/1967 | Dennis | 328/162 X |
| 3,544,895 | 12/1970 | Richman | 340/347 NT X |
| 3,883,863 | 5/1975 | Willard | 340/347 NT |
| 3,906,342 | 9/1975 | Peouts | 324/62 |
| 3,984,768 | 10/1976 | Staples | 324/62 |

*Primary Examiner*—John Kominski
*Assistant Examiner*—Vincent J. Sunderdick
*Attorney, Agent, or Firm*—Kenyon & Kenyon, Reilly, Carr & Chapin

[57] ABSTRACT

A circuit for determining the slope of a signal of a predetermined minimum duration and below an upper limit by carrying out an integration first in a positive and then in a negative direction in which means are provided to insure that the integration is carried out and an output provided only when measuring a portion of the signal which is free from disturbances.

10 Claims, 2 Drawing Figures

CIRCUIT FOR DETERMINING THE SLOPE OF A SIGNAL

BACKGROUND OF THE INVENTION

The invention relates to electrical circuits in general and more particularly to an improved circuit for determining the slope of a signal, particularly a signal which is not free from disturbances.

In various types of devices there is a need to measure the slope of an electrical signal. For example, the operational suitability of radio interference suppression resistors inserted at various points in an ignition system of an internal combustion engine depends on the resistors remaining within a resistance range between an upper and lower limit. If the resistance is too low, the suppression is inadequate and if the resistance is too high the ignition of the engine does not operate optimally. The interference suppression resistors can change their resistance in the course of the operation of an engine for various reasons to the extent that they will fall outside the specified range. In diagnosing the internal combustion engine, it is therefor desirable that the resistance of the interference suppression resistors be checked. Measuring the resistance of the individual resistors would require a large deal of time consuming labor. However, the present invention starts out from the recognition that the rise of what is known as the arc voltage line can be used as a measure of the resistance of the radio interference suppression resistors. What is meant by the arc voltage line is the waveform of the high voltage present at a spark plug after the first breakdown between its electrodes with the ignition spark burning. Thus, a measure of the resistance can be obtained by measuring the slope of the arc voltage line. For this purpose it is sufficient to connect a suitable measuring instrument to a portion of the ignition system carrying the ignition voltage.

However, the arc voltage line is not a steady curve. Instead, over the major portion of the waveform it is full of spontaneously occurring transients which result in part from the processes within the combustion chambers of the cylinders of the engine. However, between these transients there are undisturbed sections of the arc voltage line. These sections are of sufficient duration to give a rough indication of the resistance of the interference suppression resistors. Transients and undisturbed sections are distributed, as noted above, on the arc voltage line in an unpredictable manner. Thus, for this particular application it becomes apparent that there is a need for a device which can measure the slope of a voltage which contains transients hereon. In other words a device which can select from the total waveform an undisturbed portion is necessary.

SUMMARY OF THE INVENTION

The present invention provides a solution to this problem. In accordance with the present invention a circuit is provided in which the signal being measured is fed to two limit indicators through a sampling switch which is pulse controlled. The arrangement is such that there is provided to the limit indicators parallel inputs and parallel reference inputs. The outputs of the limit indicators are connected to inputs of a logic circuit which controls an integrator which integrates the signal to determine its slope.

As will be more fully described below, this arrangement causes automatic blanking of the measured values if interference signals such as brief interruptions of the arcing line or a negative slope of the arcing line occur during the time period of measurment. In a sense, this circuit picks out automatically a section of the arcing line containing no faults and determines the slope of that section. In the preferred embodiment, the sampling switch is preferably preceded by a summing circuit which has fed to it, in addition to the signal being measured, a reversed polarity signal and a d-c voltage.

A two ramp integrator is preferably used as the integrator, the integrator having in its input a polarity reversing switch which is time controlled to permit an integration in the positive direction and then in the negative direction.

The disclosed logic circuit includes a NOR gate having as inputs the outputs of the limit indicators with the output of the NOR gate connected directly as one input to a NAND gate and through a monostable multi-vibrator to the other input of the NAND gate. The NAND gate output is used as the enabling signal, through a timing generator, for the integration and for coupling the output of the integration to the final output terminal. The NOR gate can also be provided with an additional input from the integrator to disable the circuit upon the detection of a negative slope.

DETAILED DESCRIPTION OF THE PREFERRED EMBODIMENT

Figure 1:
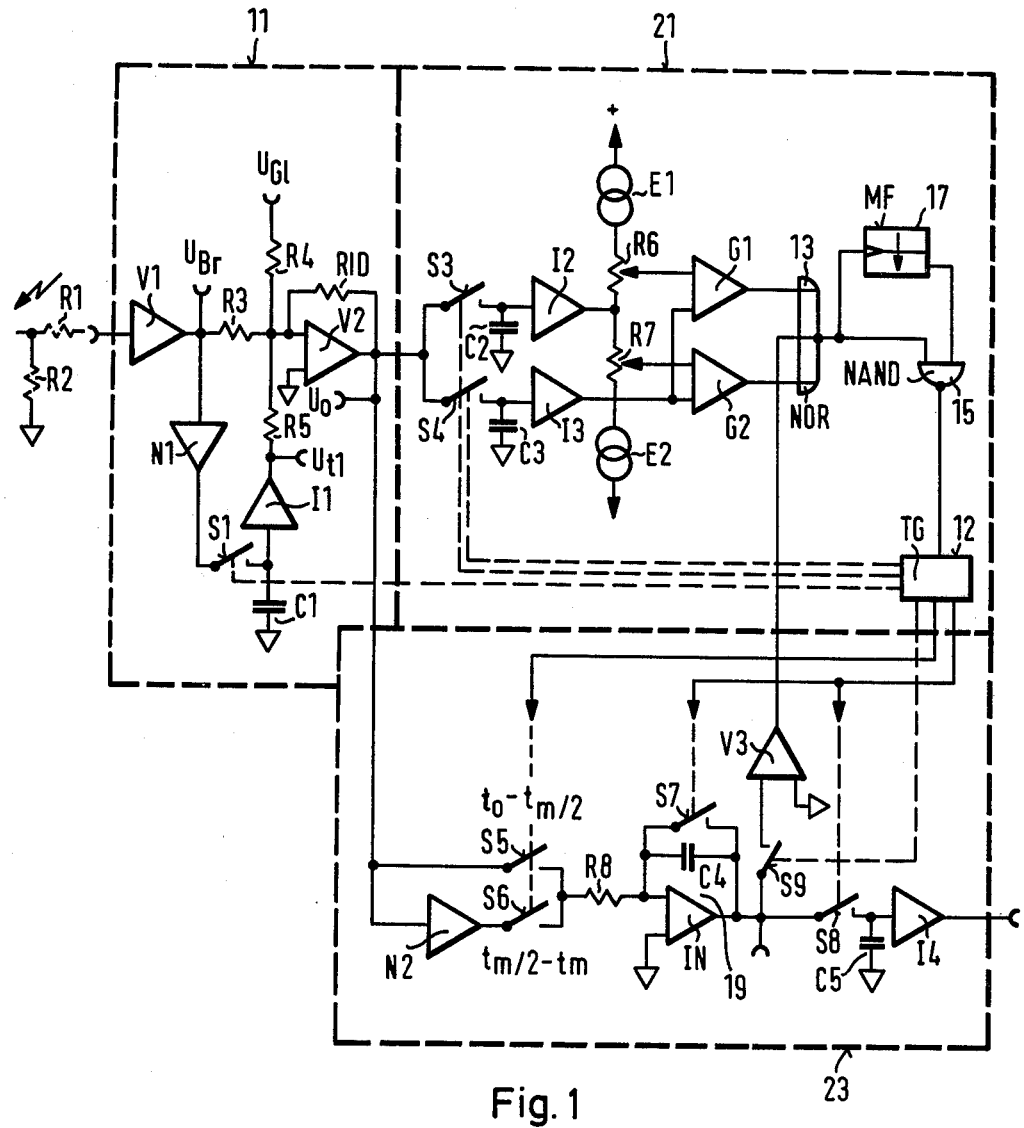
FIG. 1 is a circuit diagram of the circuit of the present invention.

As illustrated in FIG. 1 the voltage to be measured is taken from a high voltage carrying portion of the ignition system using a voltage divider comprising the resistors R1 and R2. This voltage is coupled through an amplifier V1 and a resistor R3 to a summing circuit at the input of an amplifier V2. In addition to the signal input through the resistor R3, a d-c voltage $U_{G1}$, coupled through a resistor R4, and a voltage designated $U_T$ obtained from an amplifier I1 which is coupled through a resistor R5 are provided. The output of the amplifier V1 is also connected through an inverter N1 and switch S1 to the input of the amplifier I1. The amplifier I1 has a capacitor to ground at its input. It thus acts as a high impedance isolation means for the voltage on the capacitor C1. In effect, this circuit made up of the amplifier I1 and the capacitor C1 is a sample and hold circuit. The capacitor C1 will hold the value present immediately prior to the time the switch 1 is opened. Its purpose is to provide a reference value to the summing input. The purpose of the voltage of $U_{G1}$ is to maintain a single polarity at the input to amplifier V2. In other words it provides a constant offset so that despite the polarity of the input with respect to the reference voltage $U_{G1}$, the polarity of the signal at the input to V2 will always remain the same. The amplifier V2 is a differential amplifier with its one input grounded and has negative feedback from its output to its inverting input through a resistor R10. This portion of circuit thus far described and closed within dotted lines forms a overall circuit 11 which can be designated as a signal processing circuit which develops at its output the voltage $U_0$.

The voltage at the output of the amplifier V2 is coupled through switches S3 and S4, which are controlled by a timing generator 12 to be described more fully below, to two additional sample and hold circuits. The one circuit is made up of the capacitor C2 and amplifier I2 and the second of the capacitor C3 and amplifier I3. These circuits will store in the respective capacitors the voltage present when the respective switch is closed with the amplifiers I2 and I3 providing a high impedance so that the voltage on the capacitor will not change with time. The output of the amplifier I2 is coupled to the junction of two potentiometers R6 and R7 which are coupled in series across a positive source of potential E1 and negative source potential E2. The wiper of the potentiometer R6 is coupled as a first input to a limit indicator G1 and the wiper of the potentiometer R7 as the first input of a limit indicator G2. The limit indicators G1 and G2 have as their second inputs the output of the amplifier I3. The outputs of the limit indicators are provided as two inputs to NOR gate 13. The NOR gate 13 has its output coupled directly to a NAND gate 15 and also through a monostable multivibrator 17 as the second input to the NAND gate. The output of the NAND gate is coupled to the timing generator 12.

The output signal of the amplifier V2 is also provided as an input to an integrator 19 comprising an amplifier IN with a capacitor C4 and a reset switch S7 in its feedback path. The output of the amplifier V2 is coupled through a polarity reversing arrangement made up of an inverter N2 and switches S5 and S6. The amplifier output is connected directly to switch S5 and through the inverter N2 to switch S6. The output of the two switches are tied together and coupled through a resistor R8 to the input of the integrator 19. The output of the integrator 19 is coupled through a switch S8 to a further sample and hold circuit made up of a capacitor C5 and amplifier I4. The output of this amplifier provides the final circuit output. The output of the integrator 19 is also coupled through a differential amplifier V3 as a further input to NOR gate 13. The portion of the circuit including the timing generator and elements preceding it are also enclosed in dotted lines and can be termed a transient processing circuit 21. The remainder of the circuit at the bottom of the figure, enclosed in dotted lines is the measuring circuit 23. In other words the circuit 11 processes the signal to place it in a form useable by the measuring circuit. The measuring circuit 23, under control of the timing generator, measures the slope. The circuit 21 ensures that measuring only takes place on a section of the curve where there are no transients.

The operation of the circuit will now be explained during which the construction of timing generator 12 will become apparent to those skilled in the art. In operation, the arc voltage, reduced in value by the voltage divider made up of resistors R1 and R2 is fed to the summing amplifier V2 through the amplifier V1. The amplifier V2 provides at its output a processed arc voltage for use in the transient processing circuit 21 and the measuring circuit 23. The voltage output of amplifier V2 will be as follows:

$$-U_0 = (U_{Br} - U_{t1} + U_{G1}) k,$$

where $U_{Br}$ is the arc voltage output of amplifier V1, $U_{t1}$ the arc voltage at a previous point in time $T_1$, $U_{G1}$ the d-c voltage offset and $k$ the gain of the amplifier V1. The timing generator 12 will include a clock and appropriate counters to sequence the various events that take place. In order to generate the voltage $U_t$ i.e., the voltage present at a certain point in time $t_1$, the timing generator first provides an output to close the switch S1. On FIG. 2 the arc voltage is illustrated in the upper portion which after being divided down is presented as the voltage $U_{Br}$. Curve a illustrates the closing of the switch S1. Thus, the value of the arc voltage line at that time when the switch S1 opens, designated time t1 on the figure, will be stored in the capacitor C1. This presents a reference value and is substracted from the voltage $U_{Br}$. Note that if $U_{Br}$ was sampled directly after that point it would be less than the voltage $U_t$. Thus, the constant offset $U_{G1}$ is provided to make sure that the sum of the voltage is always positive at the input of the amplifier V2. The evaluation takes place over that portion of the arc line i.e., the portion occurring after the time $t_1$, which permits determining the characteristic necessary to evaluate the resistance of the interference suppression resistors. However, it is not necessary that the whole duration of the arc line be used. All that is necessary is the measurement of a fraction of the total duration. In fact, it is possible to make a plurality of measurements during the time the arc voltage line is present. In the circuit of the present invention, once a good measurement is made, the measuring cycle is terminated.

It is of course necessary that the measurement be made over a correct span in time i.e., one where there are no disturbing transients present. The purpose of the circuit 21 is to insure that a measurement takes place only over such a section. After closing the switch S1 as indicated by the waveform a, at time t1 the switch is opened and remains opened as indicated by the waveform b. For the moment, the function of the transient processing circuit 21 will be neglected and the nature of a measurement cycle described. The measurement is carried out in accordance with the following equation which represents the difference between two integrations performed in a double ramp integrator which first integrates in a positive direction and then in a negative direction.

$$UE = \int_{t_o}^{t_o + t_{m/2}} U_o dt - \int_{t_o + t_{m/2}}^{t_o + t_m} U_o dt$$

As illustrated by FIG. 1 the switch S5 is closed from a time $t_o$ to a time of $t_{m/2}$ whereupon it is opened and the switch S6 closed from the time $t_{m/2}$ to $t_m$ is the measurement time and $t_o$ zero time at the beginning of measurement. Because the signal has an upward slope the second integration will result in a larger value so that the net result will be a negative output which, if all other conditions are correct is stored in the sample and hold circuit made up of capacitor C5 and amplifier I4 through the closing of switch S8.

Figure 2:
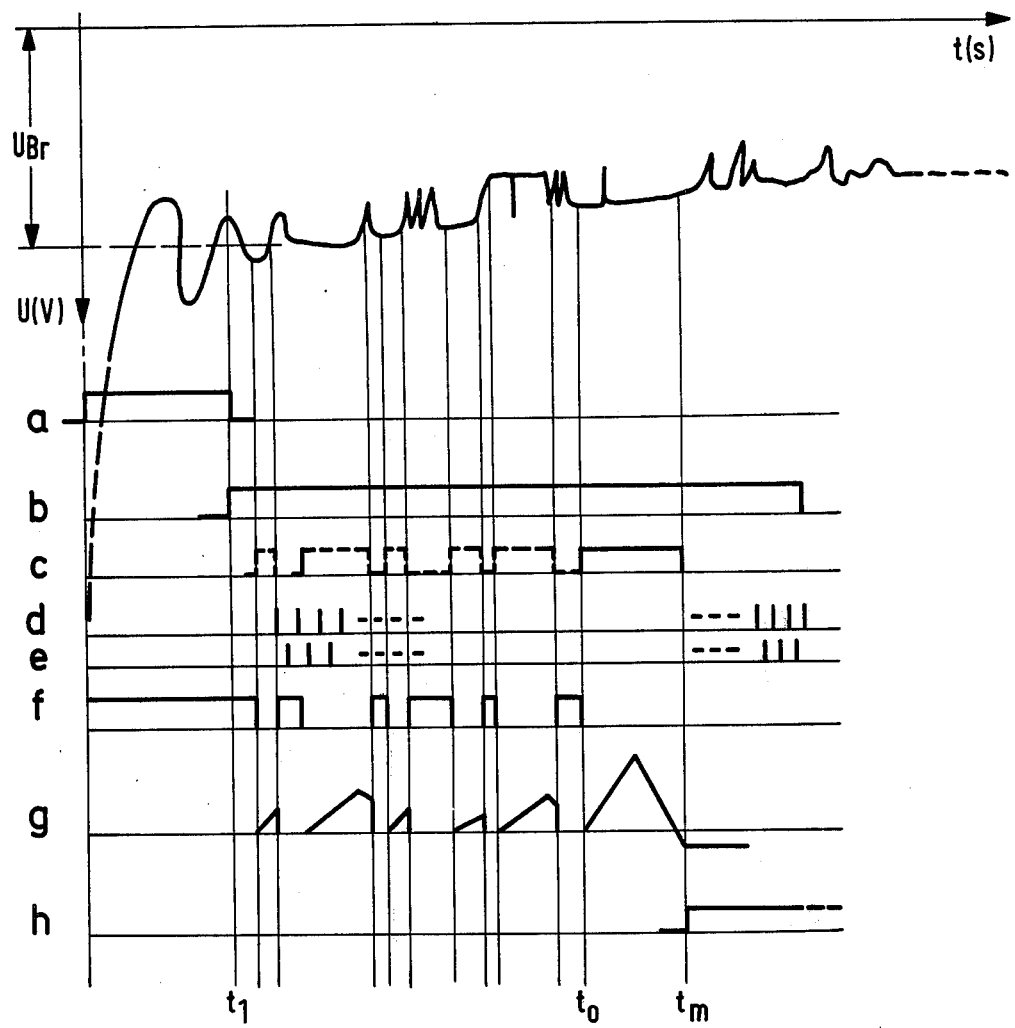
FIG. 2 is a waveform diagram showing various voltages and waveforms which appear in the circuit of FIG. 1.

With this basic understanding of the manner in which the integration is carried out, the process will now be described in further detail with reference to FIGS. 1 and 2. Once the reference value $U_t$ is determined at the time $T_1$, the timing generator provides an output, indicated on line C of FIG. 2, opening switches S7 and S8. At the same time, switch S5 is closed and an integration begins as indicated on line g. At a point thereafter a scanning pulse of short duration, represented by the pulse on line d closes the switch S3. A sample value is thus stored in the capacitor C2 and provided through the resistor divider network to the level detectors G1 and G2. these have as their second input a previously sampled value from the amplifier I3. If the value sampled and stored in the capacitor C2 and provided through I2 and the resistor network is within tolerable limits, the output of the level detectors G1 and G2, one of which detects a lower limit and the other an upper limit, will be "0". Assuming the third input to the NOR gate is also "0", it will have a "1" output which is provided to NAND gate 15. A second "1" signal is provided to NAND gate 15 by the triggering of monostable multi-vibrator 17. This signal remains for the full measuring cycle time, i.e. $t_o$–$t_m$. The NAND gate will thus have a "0" output which will indicate to the timing generator 12 that it is proper to carry out a measurement cycle. However, in the case illustrated on the figure, when the sample is taken by the first pulse on line $d$ closing switch S3, it is evident that the voltage is outside the limits. As a result, the output of the NOR gate will be a "0" resulting in a "1" output from the NAND gate as shown on waveform $f$ telling the timing generator to terminate the measurement cycle. As a result, switch S7 is closed as indicated on line $c$ of FIG. 2. As shown on line $c$ after a period of time the process is started again and once again terminated when a sample is taken which is outside the limits. This continues until at the time designated $t_o$ an integration starts and continues until time $t_m$. Although there is a slight disturbance in that period, it is of such a short duration as to not to be detected and to have no effect. At the completion of the integration cycle, the switch S8 is closed and the integrated value transferred to the sample and hold circuit made up of capacitor C5 and amplifier I4 providing the final circuit output as shown on line $h$ of FIG. 2.

Although mechanical switches are shown for sake of simplicity, it should be noted that in an actual circuit these switches will preferably be implemented using semi-conductor devices such as field effect transistor switches.

At the end of the integration, a switch S9 is closed by the timing generator to couple the output of the integrator through the amplifier V3 to the NOR gate 13. If the slope has been positive, the output of the integrator will be negative as shown by curve $g$. However, if the measured portion of the slope was negative a positive output will result. It is not desired to make a measurement under these conditions. Thus, this positive output when coupled through the amplifier V3 will provide an input to the NOR gate causing its output to change thus causing the NAND gate output to also change and terminate the measurement cycle closing switch S7 and re-starting the measurement cycle.

What is claimed is:

1. A circuit for determining the slope of a signal of predetermined minimum duration and limited slope, the signal containing transients thereon, said circuit carrying out a measurement only on a relatively undisturbed portion of said signal comprising:
   an integrator having said signal as in input for integrating said signal over a predetermined time period;
   a logic circuit for controlling the beginning and ending of the integration time period; and
   means, having said signal as an input, for causing said logic circuit to terminate an integration and re-start the integration upon detection of a transient during the measurement cycle comprising:
   1. first and second limit indicators having their outputs connected to said logic circuit;
   2. sampling means for periodical sampling the signal being measured and providing the value of said signal sampled at one time as a reference input to said limit indicators and the value of the signal sampled at a subsequent time as a second input to said limit indicators, said limit indicators providing an output to said logic circuits to terminate integration if the difference between said reference signal and said other signal is greater than a predetermined amount.

2. A circuit according to claim 1 and further including signal processing means interposed between the source of said signal and said integrator and said means for causing, comprising:
   a. means for inverting the signal;
   b. means for sampling said inverted signal;
   c. a source of fixed voltage; and
   d. means for summing said signal, said sampled inverted signal and said source of d-c voltage.

3. A circuit according to claim 1 wherein said integrator is a two ramp integrator having coupled to its input polarity reversing means, said polarity reversing means being controlled by said logic circuit.

4. A circuit according to claim 1 wherein said logic circuit comprises:
   a. a timing generator providing outputs controlling said integrator and said sampling means;
   b. a NOR gate having as inputs the outputs of said limit detector;
   c. a monostable multi-vibrator having the output of said NOR gate as an input; and
   d. a NAND gate having as a first input the output of said NOR gate and a second input the output of said monostable multi-vibrator, the output of said NAND gate being provided as an input to said timing generator to enable and disable the carrying out of an integration cycle.

5. A circuit according to claim 4 where and further including a differential amplifier coupling the output of said integrator as a further input to said NOR gate.

6. A circuit according to claim 2 wherein said signal is the arc voltage line in the ignition system of an internal combustion engine.

7. A circuit according to claim 6 and further including a voltage divider coupling said ignition system to said signal processing means.

8. A circuit for measuring the resistance of interference suppression resistors in the ignition system of an internal combustion engine comprising:
   a. a voltage divider connected to a portion of the ignition system carrying high voltage to develop a signal source;
   b. an integrator having said signal as in input for integrating said signal over a predetermined time period;
   c. a logic circuit for controlling the beginning and ending of the integration time period; and
   d. means, having said signal as an input, for causing said logic circuit to terminate an integration and re-start the integration upon detection of a transient during the measurement cycle comprising:
   1. first and second limit indicators having their outputs connected to said logic circuit;
   2. sampling means for periodical sampling the signal being measured and providing the value of said signal sampled at one time as a reference input to said limit indicators and the value of the signal sampled at a subsequent time as a second input to said limit indicators, said limit indicators providing an output to said logic circuits to terminate integration if the difference between said reference signal and said other signal is greater than a predetermined amount.

9. A circuit according to claim 8 and further including signal processing means interposed between the source of said signal and said integrator and said means for causing, comprising:
 a. means for inverting the signal;
 b. means for sampling said inverted signal;
 c. a source of fixed voltage; and
 d. means for summing said signal, said sampled inverted signal and said source of d-c voltage.

10. A circuit according to claim 9 wherein said logic circuit comprises:
 a. a timing generator providing outputs controlling said integrator and said sampling means;
 b. a NOR gate having as inputs the outputs of said limit detector;
 c. a monostable multi-vibrator having the output of said NOR gate as an input; and
 d. a NAND gate having as a first input the output of said NOR gate and a second input the output of said monostable multi-vibrator, the output of said NAND gate being provided as an input to said timing generator to enable and disable the carrying out of an integration cycle.

* * * * *